United States Patent [19]
Ramanathan et al.

[11] Patent Number: 5,948,176
[45] Date of Patent: Sep. 7, 1999

[54] CADMIUM-FREE JUNCTION FABRICATION PROCESS FOR CUINSE$_2$ THIN FILM SOLAR CELLS

[75] Inventors: Kannan V. Ramanathan, Lakewood; Miguel A. Contreras, Golden; Raghu N. Bhattacharya, Littleton; James Keane, Lakewood; Rommel Noufi, Golden, all of Calif.

[73] Assignee: Midwest Research Institute, Kansas City, Mo.

[21] Appl. No.: 08/939,844

[22] Filed: Sep. 29, 1997

[51] Int. Cl.$^6$ .................................................. H01L 31/00
[52] U.S. Cl. ........................... 136/264; 136/265; 438/57; 438/85
[58] Field of Search ................... 136/264, 265; 438/57, 85

[56] References Cited

U.S. PATENT DOCUMENTS

| | | |
|---|---|---|
| 4,242,374 | 12/1980 | Sansregret . |
| 4,327,119 | 4/1982 | Lis . |
| 4,612,411 | 9/1986 | Wieting . |
| 4,751,149 | 6/1988 | Vijayakumar . |
| 4,950,615 | 8/1990 | Basol et al. ............................. 136/264 |
| 5,474,939 | 12/1995 | Pollock . |

OTHER PUBLICATIONS

Aranovich, Optical and Electrical Properties of ZnO Films Prepared by Spray Pyrolysis for Solar Cell Applications, J. Vac. Sci. Technol., vol. 16, No. 4, pp. 994–1007, Jul. 1979.

Tomar, A ZnO/p–CuInSe2 Thin Film Solar Cell Prepared Entirely by Spray Pyrolysis, Thin Solid Films, 90, pp. 419–423, 1982.

Primary Examiner—Mark Chapman
Attorney, Agent, or Firm—Ken Richardson

[57] ABSTRACT

The present invention provides an economical, simple, dry and controllable semiconductor layer junction forming process to make cadmium free high efficiency photovoltaic cells having a first layer comprised primarily of copper indium diselenide having a thin doped copper indium diselenide n-type region, generated by thermal diffusion with a group II(b) element such as zinc, and a halide, such as chlorine, and a second layer comprised of a conventional zinc oxide bilayer. A photovoltaic device according the present invention includes a first thin film layer of semiconductor material formed primarily from copper indium diselenide. Doping of the copper indium diselenide with zinc chloride is accomplished using either a zinc chloride solution or a solid zinc chloride material. Thermal diffusion of zinc chloride into the copper indium diselenide upper region creates the thin n-type copper indium diselenide surface. A second thin film layer of semiconductor material comprising zinc oxide is then applied in two layers. The first layer comprises a thin layer of high resistivity zinc oxide. The second relatively thick layer of zinc oxide is doped to exhibit low resistivity.

11 Claims, 1 Drawing Sheet

CADMIUM-FREE JUNCTION FABRICATION PROCESS FOR CUINSE$_2$ THIN FILM SOLAR CELLS

CONTRACTUAL ORIGIN OF THE INVENTION

The United States Government has rights in this invention pursuant to Contract No. DEAC36-83CH10093 between the United States Department of Energy and the Midwest Research Institute.

BACKGROUND OF THE INVENTION

1. Field of the Invention

The present invention relates to a cadmium free thermal diffusion zinc chloride junction formation process for making high efficiency heterojunction thin film photovoltaic cells formed from compound semiconductors, in particular, copper indium diselenide, including the gallium and sulfur alloys thereof, and to the semiconductor produced thereby.

2. Description of the Prior Art

The prior art discloses several methods for the manufacture of high light to electrical energy conversion efficiency ("efficiency") thin film photovoltaic cells formed from a first layer of copper indium diselenide in heterojunction with one or more layers of cadmium sulfide ("CdS"). In Mickelsen et al, U.S. Pat. No. 4,335,266, a method is disclosed for forming the copper indium diselenide layer in two distinct regions. The first region desirably contains an excess of copper and the second region is copper deficient. Diffusion between the two layers achieves a uniform copper indium diselenide structure in order to reduce the formation of pure copper nodules near the copper indium diselenide surface where the cadmium sulfide layer is to be deposited. Despite the Mickelsen improvements in the copper indium diselenide layer, it had still been found necessary to deposit a cadmium sulfide layer to achieve high efficiency.

While various improvements have been made in the manufacture of copper indium diselenide CdS cells, several complications remain. For example, chemical bath deposition of cadmium sulfide is used to produce the highest efficiency devices. However, this step involves a slow wet chemical step inconsistent with an otherwise inline dry fabrication process. Moreover, cadmium and thiourea are highly toxic materials which escalate manufacturing costs as a result of the handling and disposal of the hazardous wastes.

Some of the attempts to avoid the handling complications inherent in use of CdS are described in "A ZnO/p-CuInSe$_2$ Thin Film Solar Cell Prepared Entirely by Spray Pyrolysis", M. S. Tomar and F. J. Garcia, Thin Solid Films, 90 (1982), p.p. 419–423; and "Chemical Vapor Deposited Copper Indium Diselenide Thin Film Materials Research" Final Report, March 1984, SERI/STR-211-2247. While these publications disclose copper indium diselenide/zinc oxide heterojunction formation using zinc oxide spray pyrolysis or ion beam sputtering respectively, neither method results in an efficiency of greater than 2–3%. Therefore, these publications do not disclose a commercially viable method for the replacement of CdS with zinc oxide in a thin film copper indium diselenide heterojunction cell.

Weiting, et al, U.S. Pat. No. 4,612,411, incorporated herein by reference, describes the preparation of a thin film heterojunction photovoltaic cell formed from copper indium diselenide, as a first semiconductor layer, and the formation of a two layer zinc oxide semiconductor in heterojunction with the copper indium diselenide. The first of the two zinc oxide layers comprises a relatively thin layer (100–2000 angstroms) of high resistivity zinc oxide and the second comprises a relatively thick (10,000 angstroms) zinc oxide layer having been doped to exhibit low resistivity.

Subsequently, Pollock et al, U.S. Pat. No. 5,474,939, has produced higher efficiency non-CdS cells through the application of a wet chemical deposition zinc hydroxide precipitation step. The Pollock process involves the use of a metal back contact having a first p-type semiconductor film of chemical vapor deposition ("CVD") copper indium diselenide and a second transparent n-type semiconductor film of CVD zinc oxide on the copper indium diselenide and a thin interfacial film, of transparent insulating zinc oxide, between the p-type copper indium diselenide film and the n-type zinc oxide. Pollock prepares the interfacial zinc oxide film by the chemical deposition of zinc hydroxide on the copper indium diselenide from a zinc salt solution and complexing agents comprising ammonium hydroxide or triethanolamine, thereby forming a zinc ammonium solution complex, and annealing the deposit to convert the zinc hydroxide into the zinc oxide. Thus, while Pollock uses a wet chemical deposition step of zinc hydroxide precipitate from solution in order to generate a thin interfacial zinc oxide layer, it is believed, that devices prepared by direct deposition of a zinc oxide layer on copper indium diselenide films are only 2–4% conversion efficient in spite of utilizing films capable of producing 15–17% cells.

SUMMARY OF THE INVENTION

Therefore, it is an object of the present invention to provide an economical, simple, dry and controllable semiconductor layer junction forming process to make cadmium free high efficiency photovoltaic cells having a first layer comprised primarily of copper indium diselenide having a thin doped copper indium diselenide n-type region, generated by thermal diffusion with a group II(b) element such as zinc, cadmium, or mercury and a halide, such as chlorine, bromine, iodine, or flourine and a second layer comprised of a conventional zinc oxide bilayer. Moreover, it is the object of this invention to eliminate the use of an interfacial extrinsic buffer layer, such as In$_2$Se$_3$/ZnIn$_2$Se$_4$, often used in the production of high efficiency cells. It is believed that interfacial layers introduce disruption at the junction region by way of a mismatch at the two interfaces and in the dissimilar nature of the materials themselves. Type conversion of the upper surface of a well crystallized copper indium diselenide grain is believed to generate a more stable junction with respect to time, light exposure and temperature.

A photovoltaic device according the present invention includes a first thin film layer of semiconductor material formed primarily from copper indium diselenide. Doping of the copper indium diselenide with zinc chloride is accomplished either through any well known CVD or sublimation process using either a zinc chloride solution or a solid zinc chloride material as the vapor source, respectively. In a preferred form, a 1% zinc chloride methanol solution is used as an extrinsic doping means followed by the evaporation of methanol. Thermal diffusion of zinc chloride into the copper indium diselenide upper region creates the thin n-type copper indium diselenide surface. The n-type region is cleaned of contaminants and a second thin film layer of semiconductor material comprising zinc oxide is applied. The zinc oxide material is preferably applied in two layers. The first layer comprises a thin layer of high resistivity zinc oxide. The second relatively thick layer of zinc oxide is doped to exhibit low resistivity.

DESCRIPTION OF THE PREFERRED EMBODIMENTS

Figure 1:
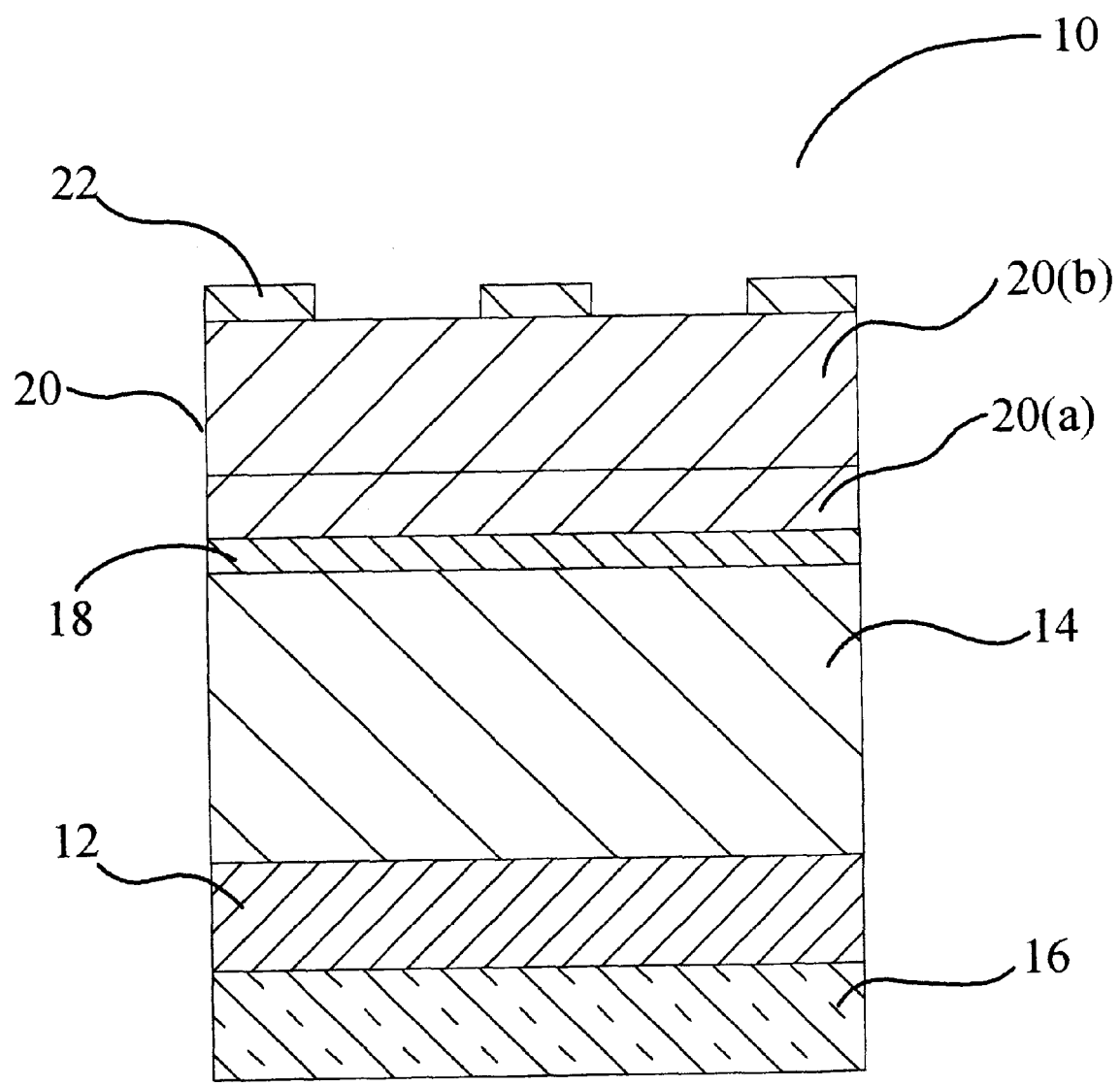
FIG. 1 is a cross-sectional illustration of a photovoltaic device made according to the method of the present invention.

The schematics of the solar cell structure are similar to that described in the above mentioned patents and in U.S. No. 4,915,745 issued to Pollock (reexamined and reissued on Apr. 7, 1992), the disclosures of which are incorporated herein by reference.

In FIG. 1, photovoltaic cell 10 is structurally supported on glass substrate 16 having a thickness of one to four millimeters thick. Back contact metal layer 12 having a thickness of approximately 1.0 micron of molybdenum is deposited on substrate 16. First active region 14 of device 10 comprises a semiconductor layer 14 which, in the preferred embodiment, is comprised primarily of p-type copper indium diselenide having a thickness of about 3 microns. A thin doped copper indium gallium diselenide n-type region 18 is generated by thermal diffusion with zinc chloride. The second active region 20 of device 10 is a zinc oxide semiconductor layer having a thickness of about 0.5 microns. Zinc oxide layer 20 is deposited in two distinct layers comprising a first high resistivity zinc oxide region 20(a) and a second low resistivity zinc oxide layer 20(b). Layer 20(a) has a thickness of about 0.5 microns zinc oxide while layer 20(b) is about 0.20–0.45 microns in thickness. High resistivity layer 20(a) comprises essentially of pure zinc oxide while layer 20(b) is doped to achieve low resistivity through any one of the well known methods. Device 10 is completed with a grid of front face contacts 22 in the form of narrow metal strips, such as silver or aluminum, typically deposited either by sputtering, evaporation, or plating.

The copper indium diselenide layer 14 may be deposited according to the process of the above-referenced Mickelsen et al patent. However, specific examples of the fabrication of the copper indium diselenide layer 14 are also described in the Weiting and Pollock references above which are incorporated herein by reference. While references herein are to a copper indium diselenide semiconductor layer various other materials may be alloyed with this layer for various purposes. For example, aluminum, gallium, tellurium, or sulfur are well known inclusions in copper indium diselenide films to adjust band gaps, and such alloyed materials are considered equivalent to copper indium diselenide for the purposes of this invention. Likewise, as in Pollock, the precise ratios of copper, indium and selenium may be adjusted to improve the qualities of the final layer, for example, in attempts to eliminate pure copper nodules.

Several test devices were fabricated to test the process of the present invention. A copper indium selenium film was prepared using a conventional three stage process. Indium and selenide having a low gallium concentration are heated to 550° C. in a selenium atmosphere with the evaporation of copper. The composition of the upper I micron of the Copper/InGaSe stack ("CIGS"), as determined by EPMA, showed that the film was copper deficient. The copper/indium plus gallium ratio was 0.85–0.9. A device with standard window layers was fabricated on one half of the CIGS film and the other half was used to test the following zinc chloride thermal diffusion process of the invention.

A solution of zinc chloride in methanol was prepared by dissolving 1 gram of zinc chloride in 100 milliliters of methanol. A few drops of the zinc chloride methanol solution was dispersed on one-half of the CIGS thin film using a dropper. The use of a zinc chloride solution as the doping source rather than solid zinc chloride was chosen for proof of concept demonstration. The methanol solvent was allowed to evaporate, leaving behind a zinc chloride layer on the surface of the CIGS film. Samples of the CIGS film having a zinc chloride layer were heated in an oven 10–60 minutes, ambient atmospheric air, at 200° C. in order to thermally diffuse zinc chloride into the surface region of the CIGS film. The samples were allowed to cool and then rinsed in deionized water. An etching step in dilute hydrochloric acid (10%) was performed in order to remove any residual layer on the CIGS surface. The etching step is believed to dissolve and etch away zinc, chloride, and any other reaction products and was done deliberately to rule out the presence of any external buffer layers on the CIGS. A thin emitter region with appreciable n-type conductivity was thus achieved. Standard zinc oxide was sputtered onto the CIGS films by any one of the well known procedures and the devices were then completed with application of a grid in the usual manner.

In the foregoing tests, the zinc chloride thermal diffusion cell resulted in a 13.5% efficient device having an open current voltage ("Voc") of 0.526. Thermal diffusion time was approximately 30 minutes. These results are comparable to our tests of other devices prepared using standard CdS/ZnO windows having a 12.6% conversion efficiency and a Voc of 0.535. By way of comparison, our ZnO/CIGS cells fabricated by sputtering a standard ZnO bilayer directly on one-half of a CIGS film, prepared in the above manner, without the zinc chloride thermal diffusion process of the present invention, resulted in low efficiencies (3–4%).

According to the present invention, doping the upper copper indium diselenide region substrate 16 having layer 12 and region 14 to generate n-type region 18, of FIG. 1, may be accomplished either by using a solid zinc chloride vapor source in a sublimation type process, or through CVD of a zinc chloride solution, preferably a 1% zinc chloride in methanol (Wt./Vol.), carried into an evacuated reactor with an inert carrier gas, such as argon. As in FIG. 1., substrate 16 with layer 12 and region 14 thereon would be located in the reactor on a heated support. We propose to use a vapor transport sublimation reaction of any one of the well known methods using solid zinc chloride as the vapor source in order to manufacture the devices herein in a dry inline process.

While the present invention has been illustrated and described with reference to particular structures and methods of fabrication, it will be apparent that other changes and modifications can be made therein with the scope of the present invention as defined by the appended claims.

What is claimed is:

1. A process for making a thin film heterojunction photovoltaic device comprising the steps of:

(a) depositing a first film of p-type copper indium diselenide film on a metal back contact (b) depositing on the upper surface of the copper indium diselenide film a group IIb halide;

(c) doping the p-type upper copper indium diselenide film surface n-type by thermal diffusion of the group IIb halide into the copper indium diselenide film surface and cleaning the n-type surface;

(d) depositing a second thin film layer of high resistivity zinc oxide; and (e) depositing a third film of n-type transparent zinc oxide on the second thin film high resistivity zinc oxide layer.

2. A process according to claim 1 wherein the group IIb halide is zinc chloride.

3. A process according to claim 2 wherein zinc chloride is deposited on the copper indium diselenide film surface from solid zinc chloride in a vapor phase through sublimation.

4. A process according to claim 2 wherein zinc chloride is deposited on the copper indium diselenide film surface from a zinc chloride solution by chemical vapor deposition.

5. A process according to claim 4 wherein the zinc chloride solution comprises zinc chloride in methanol.

6. A process according to claim 1 wherein the group IIb halide and copper indium diselenide are thermally diffused at 190–220° C.

7. A process according to claim 1 wherein the group IIb halide and copper indium diselenide are heated in contact for 10–60 minutes.

8. A process according to claim 1 wherein cleaning the n-type converted copper indium diselenide film surface comprises rinsing with deionized water and etching with dilute hydrochloric acid.

9. A process according to claim 8 wherein the hydrochloric acid solution is 10% hydrochloric acid in water.

10. A thin film photovoltaic device comprising, in order, a first layer of p-type copper indium diselenide semiconductor having a type converted upper region rendered n-type by thermal diffusion of a group IIb halide and, a second layer of high resistivity zinc oxide semiconductor in contact with said first layer, and a third layer of low resistivity zinc oxide semiconductor in contact with said second layer.

11. A device according to claim 10, wherein the group IIb halide is zinc chloride.

* * * * *

UNITED STATES PATENT AND TRADEMARK OFFICE
CERTIFICATE OF CORRECTION

PATENT NO. : 5,948,176
DATED : September 7, 1999
INVENTOR(S) : Ramanathan et al.

It is certified that error appears in the above-identified patent and that said Letters Patent is hereby corrected as shown below:

On title page, item (75)

In the Inventors:

In line 5, change "Calif." to "Colo.--.

Signed and Sealed this

First Day of February, 2000

Attest:

Q. TODD DICKINSON

Attesting Officer

Acting Commissioner of Patents and Trademarks